US008916955B2

(12) United States Patent
Peng et al.

(10) Patent No.: US 8,916,955 B2
(45) Date of Patent: Dec. 23, 2014

(54) NEARLY BUFFER ZONE FREE LAYOUT METHODOLOGY

(71) Applicant: Taiwan Semiconductor Manufacturing Co., Ltd., Hsin-Chu (TW)

(72) Inventors: Yung-Chow Peng, Hsinchu (TW); Jaw-Juinn Horng, Hsinchu (TW); Szu-Lin Liu, Hsinchu (TW); Po-Zeng Kang, Hsin-Hua (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/745,913

(22) Filed: Jan. 21, 2013

(65) Prior Publication Data

US 2014/0103494 A1    Apr. 17, 2014

Related U.S. Application Data

(60) Provisional application No. 61/714,961, filed on Oct. 17, 2012.

(51) Int. Cl.
*H01L 29/06* (2006.01)
*G06F 17/50* (2006.01)
*H01L 25/00* (2006.01)

(52) U.S. Cl.
CPC ........ *G06F 17/5081* (2013.01); *G06F 17/5068* (2013.01); *G06F 17/5063* (2013.01); *H01L 25/00* (2013.01)
USPC ........................................................ 257/618

(58) Field of Classification Search
CPC .. G06F 17/5072; H01L 27/0207; H01L 27/04
USPC .......................................................... 257/618
See application file for complete search history.

(56) References Cited

U.S. PATENT DOCUMENTS

| 6,407,434 | B1 * | 6/2002 | Rostoker et al. ............... 257/401 |
| 7,774,726 | B2 * | 8/2010 | White ............................. 716/51 |
| 7,962,867 | B2 | 6/2011 | White et al. |
| 8,001,516 | B2 | 8/2011 | Smith et al. |
| 2003/0040175 | A1 | 2/2003 | Deliwala |

(Continued)

OTHER PUBLICATIONS

Notice of Allowance Dated Feb. 21, 2014 U.S. Appl. No. 13/744,532.

(Continued)

*Primary Examiner* — Ahmed Sefer
(74) *Attorney, Agent, or Firm* — Eschweiler & Associates, LLC (57) ABSTRACT

The present disclosure relates to a layout arrangement and method to minimize the area overhead associated with a transition between a semiconductor device array and background features. A nearly buffer zone free layout methodology is proposed, wherein an array of square unit cells with a first pattern density value is surrounded by background features with a second pattern density value. A difference between the first pattern density value and second pattern density value results in a density gradient at an edge of the array. Unit cells on the edge of the array which are impacted by a shape tolerance stress resulting from the density gradient are identified and reconfigured from a square shape aspect ratio to a rectangular shape aspect ratio with along axis of the unit cell oriented in a direction parallel to the variation induced shape tolerance stress to alleviate the variation.

20 Claims, 7 Drawing Sheets

(56) References Cited

U.S. PATENT DOCUMENTS

| | | |
|---|---|---|
| 2005/0044522 A1 | 2/2005 | Maeda |
| 2005/0058416 A1 | 3/2005 | Hoon Lee et al. |
| 2005/0085932 A1 | 4/2005 | Aghababazadeh et al. |
| 2007/0101305 A1 | 5/2007 | Smith et al. |
| 2008/0135095 A1 | 6/2008 | Cummings et al. |
| 2008/0213957 A1* | 9/2008 | Balakrishnan ............... 438/197 |
| 2009/0193374 A1* | 7/2009 | Fujimoto et al. ............... 716/6 |
| 2010/0221846 A1 | 9/2010 | Widdershoven |
| 2011/0047520 A1 | 2/2011 | Chew et al. |

OTHER PUBLICATIONS

U.S. Appl. No. 13/727,691, filed Dec. 27, 2012.
U.S. Appl. No. 13/744,532, filed Jan. 18, 2013.
Office Action Dated May 8, 2014 U.S. Appl. No. 13/727,691.

* cited by examiner

NEARLY BUFFER ZONE FREE LAYOUT METHODOLOGY

REFERENCE TO RELATED APPLICATIONS

This application claims priority to U.S. Provisional Patent Application Ser. No. 61/714,961 filed on Oct. 17, 2012, entitled "Buffer Zone Free Layout Methodology", which is hereby incorporated in its entirety.

BACKGROUND

The performance of an integrated circuit formed from an array of active devices is dependent upon pattern density uniformity between active features that comprise functional components of the active devices to insure robust matching of electrical characteristics between active devices within the array. Pattern uniformity of shapes within active devices at an edge of the array is sensitive to a density gradient between the active features of the array and background features surrounding the array. To mitigate effects of the density gradient on the array a buffer zone of dummy devices is added around the array, wherein a dummy device is structurally identical to an active device, but not electrically active. The buffer zone results in better pattern uniformity between the active devices within the array, but can add significant area overhead to a chip.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Figure 1:
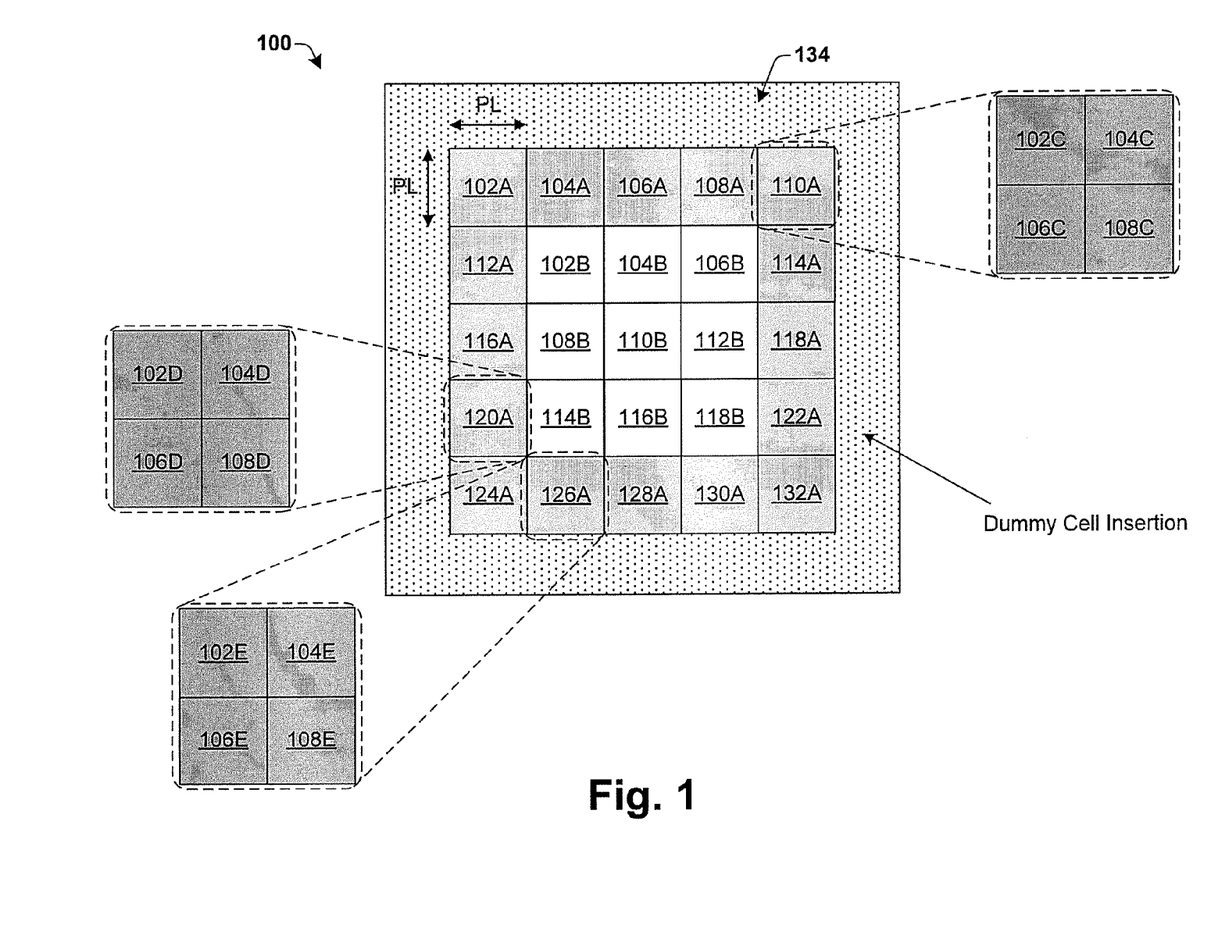
FIG. 1 illustrates a semiconductor device array comprising a buffer zone.

FIG. 1 illustrates a semiconductor device array 100 comprising a plurality of edge blocks (eBlocks) 102A-132A, a plurality of center blocks (cBlocks) 102B-118B, and background features 134, wherein the background features 134 comprise a second pattern density (e.g., poly density, oxide density, etc.) that is substantially less than a first pattern density of the semiconductor device array 100. The semiconductor device array 100 further comprises an analog circuit layout, wherein each eBlock 102A-132A and cBlock 102B-118B comprises n=4 square active unit cells, a respective active unit cell further comprising an analog device cell (e.g., eBlock 110A comprises analog device cells 102C-108C, eBlock 120A comprises analog device cells 102D-108D, eBlock 126A comprises analog device cells 102E-108E, and the others are not shown). Note that for subsequent analysis each eBlock 102A-132A and cBlock 102B-118B may comprise n=an integer number of square analog device cells.

A respective analog circuit layout of semiconductor device array 100 further comprises a complementary metal-oxide-semiconductor (CMOS) device. Arrays of CMOS devices tend to show higher variability within edge cells (i.e., analog device cells formed within eBlocks 102A-132A) than within center cells (i.e., analog device cells formed within cBlocks 102B-118B), resulting from a pattern density gradient between the first pattern density and the second pattern density near the array edges. The density gradient induces a shape tolerance stress on the analog device cells within eBlocks 102A-132A. Note that size of eBlocks 102A-132A is defined to be equal to an observed penetration length (PL) of the shape tolerance stress within semiconductor device array 100 resulting from the pattern density gradient.

A pattern density gradient of greater than approximately 10% at an edge of the semiconductor device array 100 can result in the shape tolerance stress on designed layers (e.g., poly, oxide, etc.) which can be observed by measuring variation of electrical characteristics of edge cells relative to center cells. Decreasing this variation improves overall performance of semiconductor device array 100. To achieve this, some prior art approaches utilize a buffer zone around semiconductor device array 100 comprising dummy device cells, wherein a dummy device cell is structurally identical to the analog device cell, but not electrically active. While the addition of a buffer zone can improve electrical performance of semiconductor device array 100, the improved performance comes at a cost of additional chip space, thus decreasing overall area efficiency.

Accordingly, the present disclosure relates to a layout arrangement and method to minimize the area overhead associated with a transition between a semiconductor device array and background features. A nearly buffer zone free layout methodology is proposed, wherein an array of square unit cells comprising a first density region with a first pattern density value is surrounded by background features comprising a second density region with a second pattern density value. A difference between the first pattern density value and second pattern density value results in a density gradient at an edge of the array. Unit cells on the edge of the array which are impacted by a shape tolerance stress resulting from the density gradient are identified and reconfigured from a square shape aspect ratio to a rectangular shape aspect ratio with along axis of the unit cell oriented in a direction parallel to the shape tolerance stress to alleviate the variation due to a shape tolerance stress.

Figure 2A:
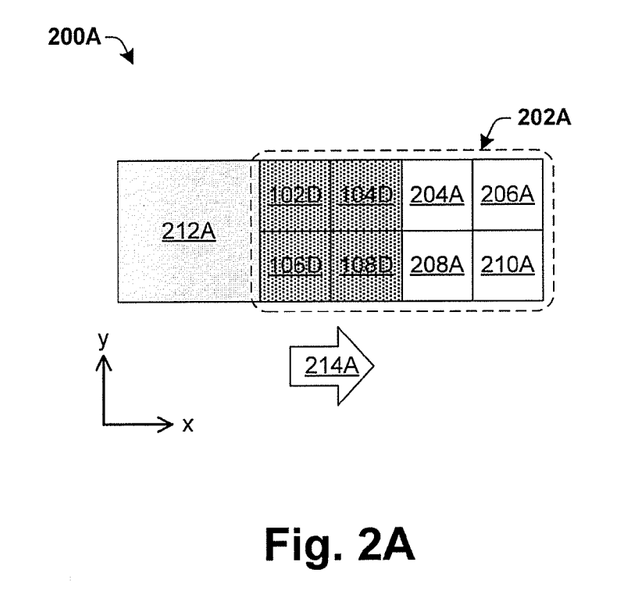
FIG. 2A illustrates a transition region from an array of unit cells to background features.

FIG. 2A illustrates a transition region 200A from an array 202A of unit cells 204A-210A to background features 212A, wherein edge cells 102D-108D disposed at a boarder of the array 202A are subject to a shape tolerance stress 214A induced by a density gradient between a first pattern density value of the array 202A and second pattern density value of the background features 212A. To achieve an overall reduction in the impact of the shape tolerance stress, edge cells 102D-108D their shape aspect ratio is reconfigured.

Figure 2B:
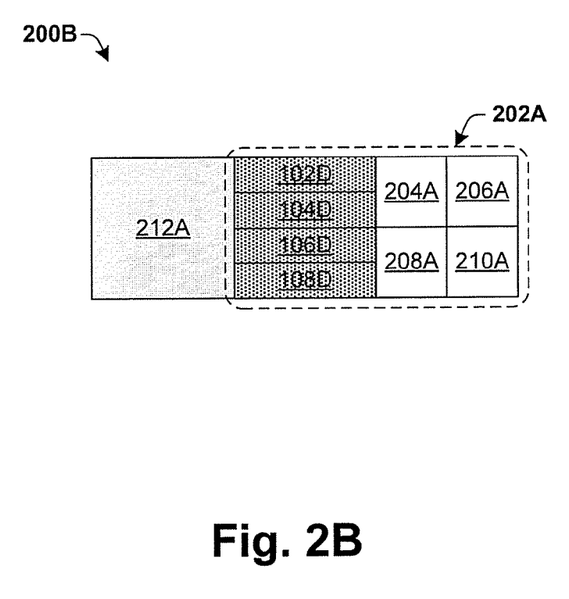
FIG. 2B illustrates some embodiments of reconfigured edge cells within a transition region from an array to background features.

FIG. 2B illustrates some embodiments of reconfigured edge cells 102D-108D within a transition region 200B from the array 202A to the background features 212A. The a shape aspect ratio of edge cells 102D-108D are reconfigured to from approximately 1:1 in FIG. 2A to greater than 1:1 in the embodiments of FIG. 2B, wherein a long axis of a respective edge cell 102D-108D is oriented in a direction perpendicular to a border (i.e., the y-direction) between the array 202A to the background features 212A formed by edge cells 102D-108D. This orientation is parallel to the shape tolerance stress 214A which alleviates variation induced by the shape tolerance stress. For the embodiments of FIGS. 2A-2B the pattern density gradient is greater than approximately 10%, resulting in a shape tolerance stress with a penetration length (PL) of greater than a width of a unit cell.

Figure 3A:
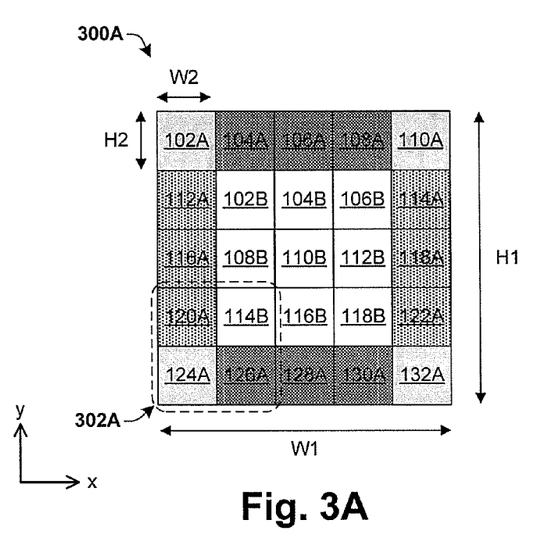
FIG. 3A illustrates a semiconductor device array comprising a plurality of edge blocks and a plurality of center blocks surrounded by background features.
Figure 3B:
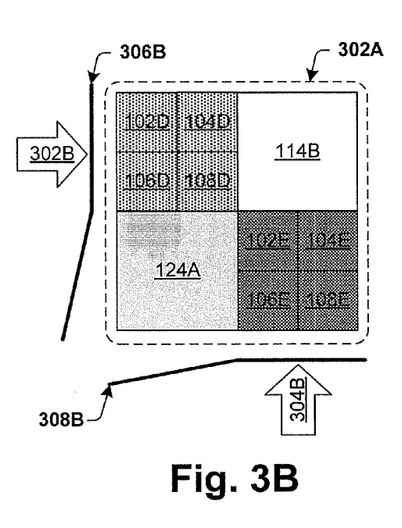
FIG. 3B illustrates a subsection of a semiconductor device array to further illustrate manufacturing process-related stresses.
Figure 3C:
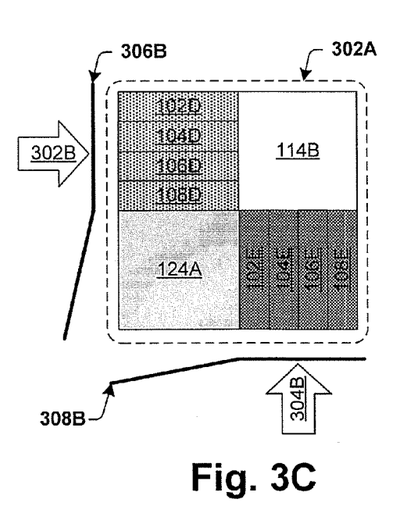
FIG. 3C illustrates some embodiments of a subsection of a semiconductor device array wherein the edge cells have been reconfigured to reduce shape tolerance variation.

Manufacturing process-related stresses can be decomposed into orthogonal components. A rectangular layout cell (i.e., with a shape aspect ratio greater than 1:1) can reduce shape tolerance variation within edge cells, thus decreasing an overall variability of an array. FIGS. 3A-3C illustrate some embodiments of reconfiguring the shape aspect ratio of edge cells disposed within an edge region of an array. FIG. 3A illustrates a semiconductor device array 300A comprising a plurality of eBlocks 102A-132A and a plurality of cBlocks 102B-118B surrounded by background features (not shown) of substantially different density (i.e., a difference of than approximately 10%). For the embodiments of FIGS. 3A-3C, cBlocks 102B-118B comprise comparatively low shape tolerance variation (only common-mode noise which serves as a baseline variability for all shapes). eBlocks 104A-108A and 126A-130A are subject to y-gradient variation (i.e., shape tolerance stress effectively in the y-direction). eBlocks 112A-122A are subject to x-gradient variation (i.e., shape tolerance stress effectively in the x-direction). eBlocks 102A, 110A, 124A, and 132A are subject to 2-dimensional (2D) variation (i.e., shape tolerance stress in both the x-direction and the y-direction). Semiconductor device array 300A further comprises an array height (H1) of 100 µm and an array width (W1) of 100 µm, composed of a 5×5 array of blocks (i.e., eBlocks 102A-132A and cBlocks 102B-118B), wherein each block comprises a block height (H2) of 20 µm and a block width (W2) of 20 µm in accordance with a PL of 20 µm for the manufacturing process-related stress. An edge region comprising eBlocks 102A-132A further comprises an edge region width of approximately a single block width of 20 µm.

FIG. 3B illustrates a subsection 302A of semiconductor device array 300A to further illustrate manufacturing process-related stresses. eBlock 120A comprises n=4 edge cells 102D-108D, each comprising a shape aspect ratio of approximately 1:1. Note that in general the subsequent analysis applies for n=an integer number of edge cells, and that the n=4 is an exemplary embodiment to facilitate understanding. An x-axial stress 302B resulting from an x-gradient between the semiconductor device array 300A and background features influences a vertical edge of semiconductor device array 300A. The edge cells 102D-108D are subject to a shape tolerance stress with only an effective x-component (i.e., x-axial stress 302B with negligible y-axial variation 306B along a vertical common run length with edge cells 102D-108D). Similarly, edge cells 102E-108E are subject to a shape tolerance stress with only an effective y-component (i.e., y-axial stress 304B with negligible x-axial variation 308B along a horizontal common run length with edge cells 102E-108E). eBlock 124A is subject to 2D shape tolerance stress due to the x-axial stress 302B with y-axial variation 306B along a vertical common run, and a y-axial stress 304B with x-axial variation 308B along a horizontal common.

FIG. 3C illustrates some embodiments of the subsection 302A of semiconductor device array, wherein edge cells 102D-108D and edge cells 102E-108E have been reconfigured to reduce shape tolerance variation due to manufacturing process-related stresses. For the embodiments of FIGS. 3A-3C a block width of 20 µm corresponds to the PL for the manufacturing process-related stress. To offset the x-axial stress 302B, the shape aspect ratio of edge cells 102D-108D have been reconfigured from approximately 1:1 to approximately 4:1 with an extent of a long axis (i.e., x-axis) of edge cells 102D-108D approximately equal to the PL of 20 µm. Similarly, to offset the y-axial stress 304B, the shape aspect ratio of edge cells 102E-108E have been reconfigured from approximately 1:1 to approximately 4:1 with an extent of a long axis (i.e., y-axis) of edge cells 102D-108D approximately equal to the PL. In general, edge cells 102D-108D and edge cells 102E-108E are iteratively reconfigured such that a shape aspect ratio of each edge cell within each eBlock along a perimeter of the device array while conserving an area of each edge cell from the set of edge cells 102D-108D and edge cells 102E-108E within the edge region. Edge cells located in eBlocks that have a non-zero run length with a unit cell located within cBlocks 102B-118B (i.e., not contained within the edge region) are ignored (i.e., edge cells located within eBlocks 102A, 110A, 124A, and 132A).

In general, for an eBlock containing n edge cells wherein n is an integer, a shape aspect ratio of a reconfigured edge cell is approximately n:1. Moreover, for a given PL, the long axis of the edge cell to comprises a dimension of approximately PL and the short axis of the edge cell to comprise a dimension of approximately the penetration length divided by n (i.e., PL/n). It may also be noted that for array partitioning conditions wherein a respective eBlock and a respective cBlock each comprises a square aspect ratio of approximately 1:1 with approximately equal dimensions with n unit cells/edge cells per respective cBlock/eBlock, that the respective edge cell comprises an aspect ratio (AR) which is approximately equal to a square of a ratio of an edge length of the unit cell to an edge length of the short axis of the edge cell over unity:

$$\text{Aspect Ratio} = \left(\frac{\text{Unit Cell Edge Length}}{\text{Edge Cell Short Axis Edge Length}}\right)^2 : 1.$$

Note that for the embodiments of FIGS. 3A-3C the value of PL is the same in both the x-direction and the y-direction. This results mainly from a symmetric illumination condition for shape patterning in optical lithography (i.e., quadrapole illumination). Other embodiments comprise an asymmetric illumination condition (i.e., dipole illumination), wherein the value of PL differs in the x-direction relative to the y-direction. In such embodiments eBlocks 104A-108A and 126A-130A comprise a first size and a shape aspect ratio of approximately 1:1, and eBlocks 112A-122A comprise a second size and a shape aspect ratio of approximately 1:1, wherein the first size and the second size are not equal. Moreover, eBlocks 102A, 110A, 124A, and 132A comprise rectangles with a first axis the first size and a second axis the second size.

Figure 4:
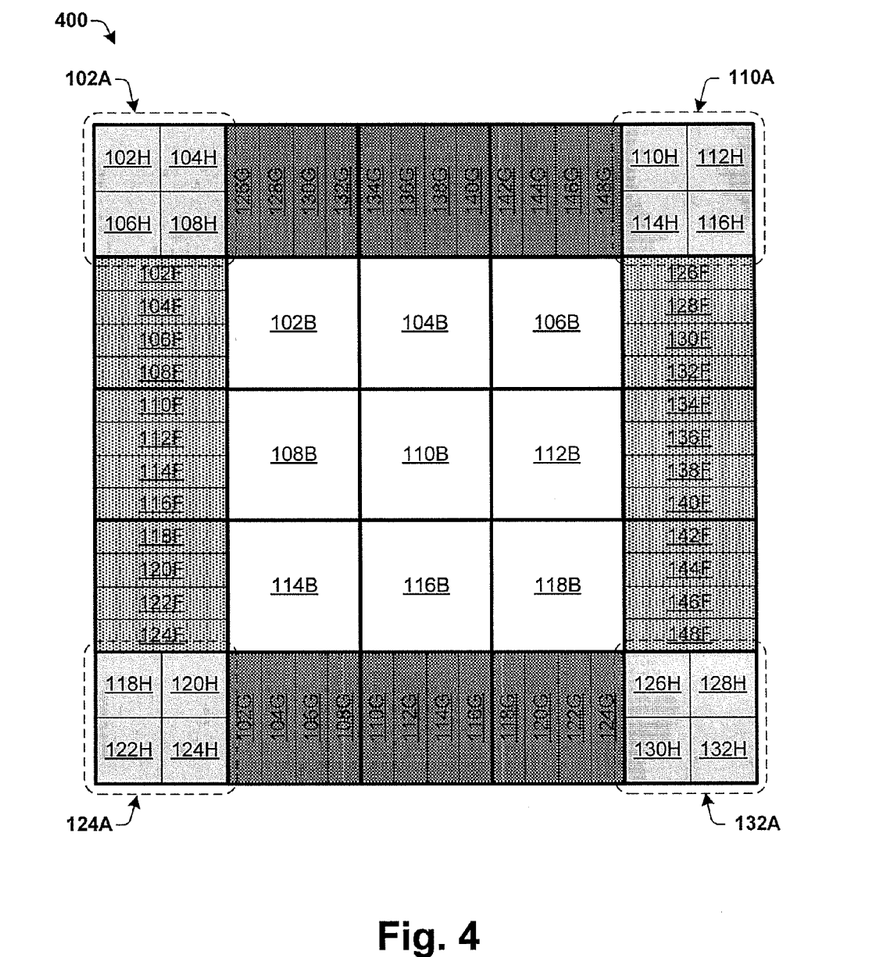
FIG. 4 illustrates some embodiments of a semiconductor device array with an active edge region configured as a variation reducing region.

FIG. 4 illustrates some embodiments of a semiconductor device array 400 with an active edge array configured as a variation reducing region. Edge cells 102F-148F and 102G-148G have been iteratively reconfigured resulting in a long axis edge length that is approximately equal to PL, while conserving an area of each edge cell 102F-148F and 102G-148G. An edge region width is therefore also approximately equal to PL. Unit cells within cBlocks 102B-118B (i.e., a center array) comprise a shape aspect ratio of approximately 1:1 and approximately identical layout topologies resulting in approximately equal pattern densities. For abutting unit cells within semiconductor device array 400, an overall pattern density value of the semiconductor device array 400 is approximately equal to the pattern density value of the unit cell. eBlocks 102A, 110A, 124A, and 132A have been omitted from consideration due to 2D stresses which cannot be alleviated with a uniaxial reconfiguration. Despite this, overall variability of the edge cells is improved.

In some embodiments semiconductor device array 400 comprises a metal-oxide-semiconductor (MOS) device layout for a 10-bit current steering digital-to-analog converter (DAC) configured for video TV/DTV graphics applications. In some embodiments semiconductor device array 400 comprises a MOS transistor layout configured for successive approximation analog-to-digital converter (SAR-ADC) cellular applications.

Figure 5A:
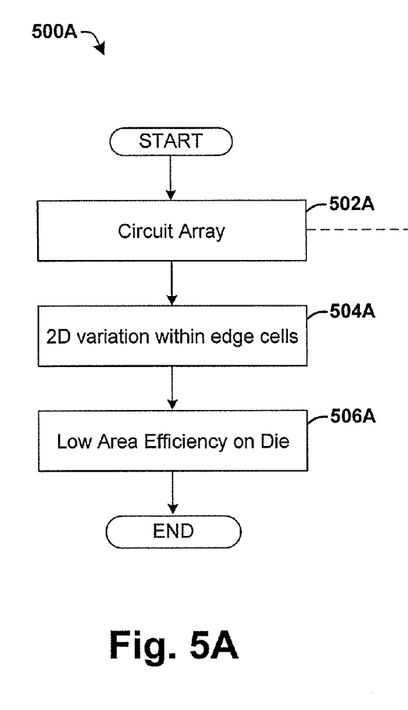
FIG. 5A-5B illustrates some embodiments of a method to reconfigure a semiconductor device array to alleviate shape tolerance stress induced on the array.
Figure 5B:
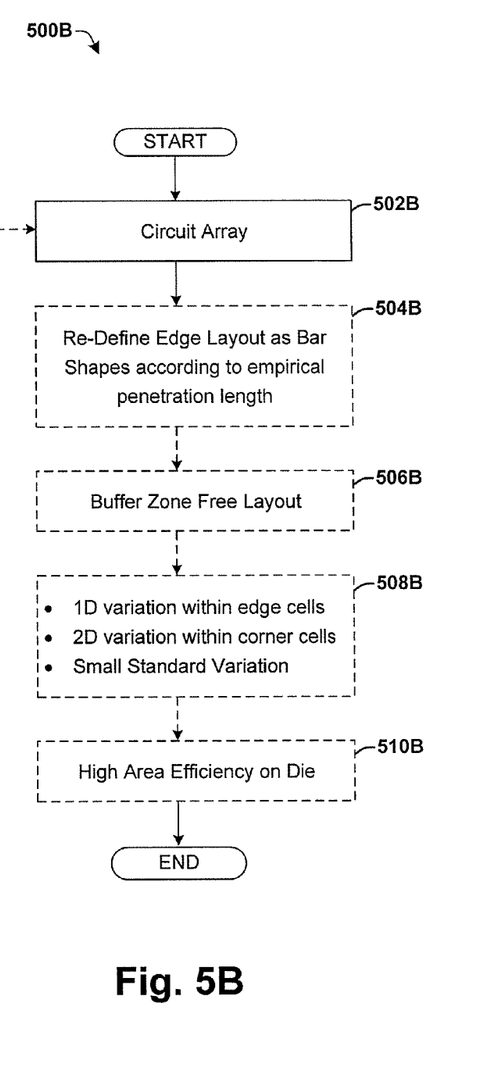

FIG. 5 illustrates some embodiments of a method 500B to reconfigure a semiconductor device array to alleviate the variation induced by shape tolerance stress on the array. In the absence of reconfiguration of edge cells, the method 500A would follow, wherein a semiconductor device array is disposed, a high shape tolerance results in an edge region of the subject to shape tolerance stress resulting from a density gradient across a boundary of the semiconductor device array (504B), resulting in a low area efficiency 506A due either to a buffer zone or a high measured variation of electrical characteristics of edge cells relative to center cells. To improve area efficiency the method 500B is used. While method 500B is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502B semiconductor device arrangement is disposed comprising an array of device cells of a first density surrounded by background features of a second density, where the density gradient between the array and background features is greater than approximately 10%. In some embodiments the device array comprises a MOS device layout for a current steering digital-to-analog converter DAC. In some embodiments the device array comprises an MOS transistor layout configured for SAR-ADC applications.

At 504B a density gradient across a boundary of the array induces the shape tolerance stress that acts along a direction parallel to a density gradient for cells within an edge region of the array, wherein width of the edge region is approximately equal to a penetration length (PL) of the shape tolerance stress. The array is then partitioned into a plurality of blocks, wherein a block comprises a shape aspect ratio of approximately 1:1 and contains an integer number of unit cells (n), and a size of a respective block is approximately equal to PL. The shape aspect ratio of edge cells within the edge region is reconfigured from approximately 1:1 into approximately n:1, with a long axis of the edge cell oriented parallel to a direction of the shape tolerance stress.

At 506B a resultant nearly buffer zone free layout array is formed.

At 508B the buffer zone free layout array is subjected to a minimized 1D shape tolerance variation along the long axis of edge cells within vertical/horizontal eBlocks of the array, and a 2D shape tolerance variation of edge cells within corner eBlocks of the array.

At 510B the array of device cells results in improved area efficiency over method 500A.

Figure 6:
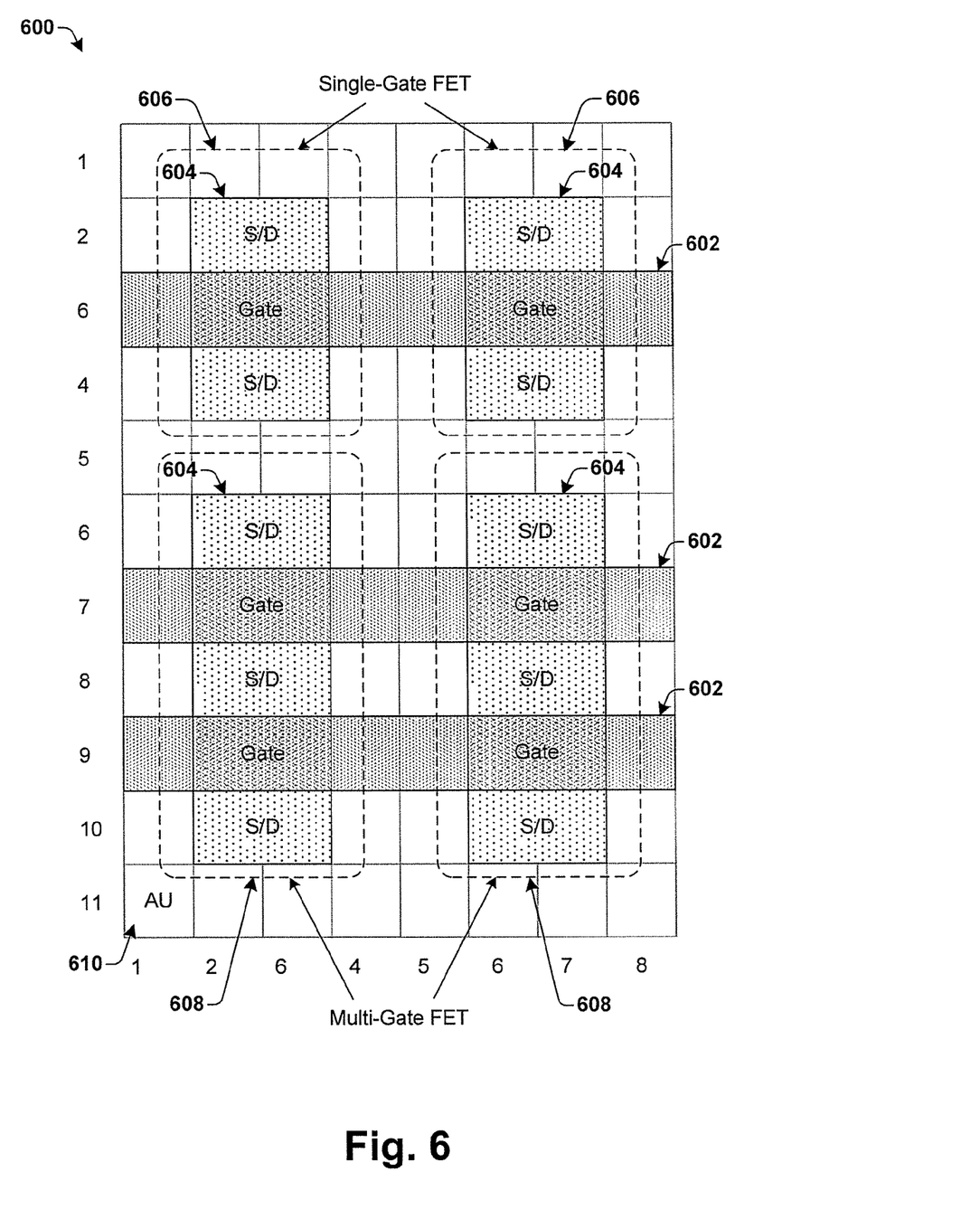
FIG. 6 illustrates some embodiments of transistor layouts for measuring pattern densities.

FIG. 6 illustrates some embodiments of transistor layouts 600 for measuring pattern densities, comprising three gate materials 602 and four active areas 604, which form two single-gate Field Effect Transistors (FETs) 606 and two multi-gate FETs 608. In the embodiment of FIG. 6 a multi-gate FET 608 comprises two gates. The gate materials 602 and active areas 604 are drawn on a course grid such that each of their two-dimensional areas may be expressed in terms on an area unit (AU) 610. The total layout area for a region of the embodiments of transistor layouts 600 is 8 AU×11 AU=88 $AU^2$. The total layout area of the gate materials 602 is 8 AU×1 AU×3=24 $AU^2$. The total layout area of the active areas 604 is (2 AU×5 AU×2)+(2 AU×3 AU×2)=32 $AU^2$. Therefore, a pattern density may be defined for the gate materials 602 as the total layout area of the gate materials 602 divided by the total layout area for the region of the embodiments of transistor layouts 600=24 $AU^2$/88 $AU^2$=27%. Similarly, a pattern density may be defined for the active areas 604 as 32 $AU^2$/88 $AU^2$=36%. In general a pattern density for shape A may be defined as:

$$\text{Pattern Density of Shape } A = \frac{\text{Total Layout Area of Shape } A}{\text{Total Layout Area}}.$$

Figure 7A:
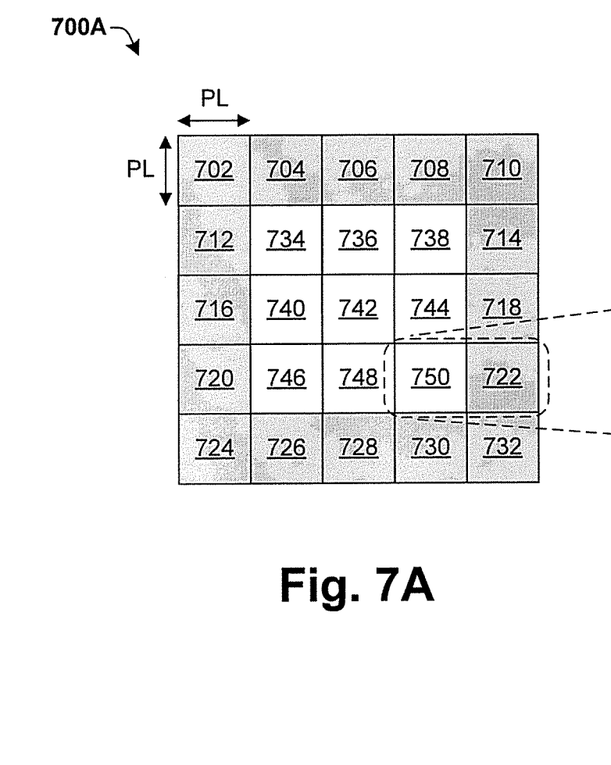
FIGS. 7A-7B illustrate some embodiments of size and shape aspect ratio determination for reconfigured edge cells.
Figure 7B:
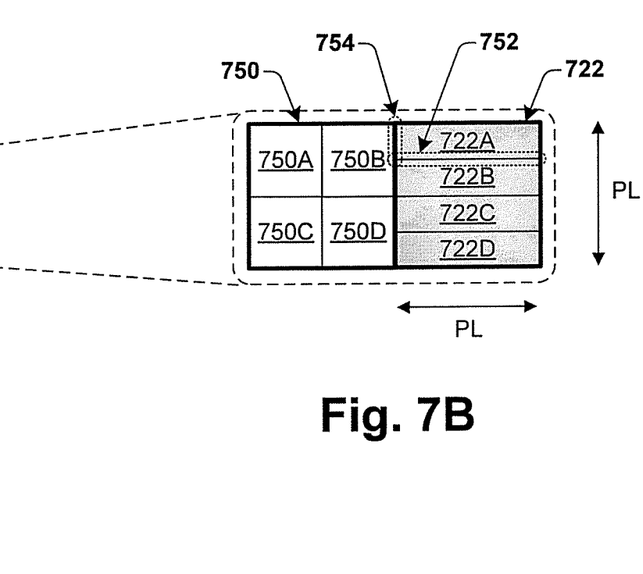

FIGS. 7A-7B illustrate some embodiments of size and shape aspect ratio determination for reconfigured edge cells. FIG. 7A illustrates some embodiments of a semiconductor device array 700A comprising eBlocks 702-732 and cBlocks 734-750 of equal dimensions and equal pattern density, wherein a respective eBlock comprises n=4 reconfigured edge cells and a respective cBlock comprises n=4 unit cells. Note that in an exemplary embodiment of size and shape aspect ratio determination for reconfigured edge cells may comprise n=an integer number of square analog device cells. eBlocks 702-732 and cBlocks 734-750 comprises a rectangular aspect ratio and a dimension of approximately a penetration length (PL) of a manufacturing process-related stress resulting from a pattern density gradient between semiconductor device array 700A and background features (not shown), wherein PL is approximately equal to 20 μm for the embodiments of FIGS. 7A-7B. eBlocks 702-732 further comprise a stress-induced variation reducing region, wherein a respective edge cell within the stress reducing region has been reconfigured from a square aspect ratio of approximately 1:1 to a rectangular aspect ratio of approximately 4:1, and wherein an non-reconfigured edge cell is identical to a unit cell.

FIG. 7B illustrates some embodiments of a stress-induced variation reducing region 700B at an edge of semiconductor device array 700A, comprising an exploded view of cBlock 750 and eBlock 722. cBlock 750 further comprises n=4 unit cells 750A-750D, wherein a respective unit cell 750A-750D comprises a square aspect ratio of approximately 1:1 and a dimension of approximately 10 µm by 10 µm. eBlock 722 further comprises n=4 edge cells 722A-722D, wherein a respective edge cell 722A-722D comprises a rectangular aspect ratio of approximately n:1, or of approximately 4:1 for n=4 edge cells per eBlock, a long axis 752 comprising a dimension of approximately PL=20 µm, and a short axis 754 comprising a dimension of approximately PL/n=20 µm/4=5 µm. Note that an area of a respective unit cell 750A-750D is approximately equal to an area of a respective edge cell 722A-722D of approximately 100 µm².

An aspect ratio of a respective edge cell 722A-722D and resultant dimensions may be determined for cBlocks 734-750 comprising a square shape aspect ratio of approximately 1:1 further comprising n unit cells with a square shape aspect ratio of 1:1, and eBlocks 702-732 comprising a square shape aspect ratio of approximately 1:1 further comprising n edge cells, wherein a long axis of a respective edge cell spans PL. On wafer semiconductor device array 700A will not appear as a 5×5 array of eBlocks 702-732 and cBlocks 734-750 but rather a 10×10 array of unit cells and edge cells (i.e., there are n=4 unit cells/edge cells per eBlock 702-732/cBlock 734-750). As is demonstrated by FIG. 4B, under the aforementioned constraints a respective edge cell 722A-722D comprises an aspect ratio which is approximately equal to a square of a ratio of an edge length of a respective unit cell to an edge length of the short axis of the edge cell 722A-722D over unity.

$$\text{Aspect Ratio} = \left(\frac{\text{Unit Cell Edge Length}}{\text{Edge Cell Short Axis Edge Length}}\right)^2 :1 = \left(\frac{10 \text{ µm}}{5 \text{ µm}}\right)^2 :1 = 4:1.$$

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a layout arrangement and method to minimize the area overhead associated with a transition between a semiconductor device array and background features. A buffer zone free layout methodology is proposed comprising an array of square unit cells with a first pattern density value and background features with a second pattern density value. A difference between the first pattern density value and second pattern density value results in a density gradient at an edge of the array. Unit cells on the edge of the array which are impacted by a shape tolerance stress resulting from the density gradient are identified and are reconfigured from a square shape aspect ratio to a rectangular shape aspect ratio with along axis of the unit cell oriented in a direction parallel to the shape tolerance stress to alleviate the variation induced by shape tolerance stress.

In some embodiments, an edge cell of a layout comprising an array of unit cells comprises a first pattern density value, and background features comprise a second pattern density value that is different than that of the first pattern density value. A shape tolerance stress results from a density gradient between the first pattern density value and second pattern density value. Reconfiguring of a shape aspect ratio of the edge cell from approximately 1:1 into greater than 1:1 alleviates the variation induced by the shape tolerance stress, wherein a long axis of the edge cell is oriented in a direction parallel to the shape tolerance stress.

In some embodiments a layout comprising an array of unit cells is partitioned into a plurality of blocks, wherein a block comprises a shape aspect ratio of approximately 1:1 and contains n unit cells, wherein n is an integer. An edge region of the array comprising subset of blocks that abut an outside edge of the array, and a plurality of edge cells comprising a subset of unit cells contained within the edge region, are identified. A shape aspect ratio of each edge cell is reconfigured from approximately 1:1 to approximately n:1 to minimize the shape tolerance variation within the array resulting from shape tolerance stress.

In some embodiments, a semiconductor device arrangement is formed by an array comprising a plurality of unit cells with a first pattern density, and background features with a second pattern density, wherein the array is segregated from the background features by a stress-induced variation reducing region comprising a plurality of unit cells configured with a rectangular shape aspect ratio greater than 1:1 to alleviate that variation induced by the shape tolerance stress resulting from a density gradient between the array and the background circuitry.

What is claimed is:

1. A layout method, comprising:
   identifying an edge cell as a unit cell arranged along a border between an array of unit cells with a first pattern density value and background features with a second pattern density value; and
   changing a cell shape aspect ratio of the edge cell from approximately 1:1 to greater than 1:1 to reduce variation of unit cell features induced by a shape tolerance stress that results from a density gradient between the first pattern density value and second pattern density value, wherein a long axis of the edge cell is oriented in a direction perpendicular to the border and parallel to the shape tolerance stress.

2. The method of claim 1, wherein the first pattern density value differs from the second pattern density value by greater than approximately 10%.

3. The method of claim 1, further comprising:
   identifying an edge region of the array as a region of the array comprising unit cells which are subject to the shape tolerance stress; and
   changing the cell shape aspect ratio of a unit cell within the edge region to comprise a long axis length that is approximately equal to a width of the edge region.

4. The method of claim 3, wherein the width of the edge region is approximately equal to a penetration length of the shape tolerance stress.

5. The method of claim 3, further comprising conserving an area of the unit cell within the edge region when changing the cell shape aspect ratio.

6. The method of claim 5, wherein:
each unit cell not within the edge region comprises the cell shape aspect ratio of approximately 1:1; and
each unit cell not within the edge region comprises approximately identical layout topologies resulting in approximately equal pattern densities.

7. The method of claim 1, wherein identifying the edge cell comprises:
partitioning the array of unit cells into a plurality of blocks, wherein a block comprises a block shape aspect ratio of 1:1 and contains n unit cells, wherein n is an integer;
identifying an edge region of the array comprising subset of blocks that abut or overlap an outside edge of the array; and
identifying the edge cell as a unit cell contained within the edge region.

8. The method of claim 7, further comprising:
configuring a block width to be approximately equal to a penetration length of the shape tolerance stress within the array;
defining an edge region width to be approximately equal to the block width, such that the edge region is approximately a single block wide; and
wherein unit cells within the array but outside the edge region are essentially unaffected by the shape tolerance stress.

9. The method of claim 8, further comprising reconfiguring the cell shape aspect ratio of the edge cell from approximately 1:1 to approximately n:1, resulting in an overall reduction in shape tolerance stress on the array.

10. The method of claim 9, further comprising:
reconfiguring the long axis of the edge cell to comprise a first dimension of approximately the penetration length; and
reconfiguring a short axis of the edge cell to comprise a second dimension of approximately the penetration length divided by n.

11. The method of claim 10, further comprising:
identifying an edge block as the block within the edge region with a block edge that abuts a unit cell not contained within the edge region; and
reconfiguring the cell shape aspect ratio of the edge cell within the edge block such that the long axis of the edge cell is oriented perpendicular to the abutting edge.

12. The method of claim 11, further comprising:
reconfiguring the cell shape aspect ratio of each edge cell within each edge block along a perimeter of the array while conserving an area of each edge cell within the edge region; and
ignoring edge cells located in blocks that have a non-zero run length with the unit cell not contained within the edge region.

13. The method of claim 1, further comprising:
measuring a variation of electrical characteristics of unit cells near the edge of the array relative to one or more unit cells near a center of the array; and
identifying the unit cells near the edge with the variation that is larger than a threshold as being subject to the shape tolerance stress.

14. The method of claim 13, further comprising:
determining a number of unit cells that have the variation larger than the threshold along the direction perpendicular to the border of the array; and
defining a penetration length of the shape tolerance stress as the number of unit cells multiplied by a width of an individual unit cell.

15. A layout method, comprising:
providing a layout including an array of unit cells having a first pattern density value and which is surrounded by a background layout region having a second pattern density value, which is different than the first pattern density value, wherein an edge region of the array separates unit cells in a central region of the array from the background layout region; and
modifying the layout by increasing a first dimension of the unit cells within the edge region along a first direction perpendicular to a border between the array and the background layout, while decreasing a second dimension of the unit cells within the edge region along a second direction parallel to the border.

16. The method of claim 15, wherein a first value of an area of the unit cell within the edge region before modifying the layout is about equal to a second value of the area of the unit cell after modifying the layout.

17. The method of claim 16, wherein modifying the layout reduces variation of layout shapes of the unit cells within the edge region induced by a shape tolerance stress that results from a density gradient between the first pattern density value and second pattern density value.

18. The method of claim 17, wherein a width of the edge region along the first direction is greater than or equal to a penetration length of the shape tolerance stress within the array of unit cells.

19. The method of claim 18, wherein the first dimension of the unit cells within the edge region is increased to be greater than or equal to the penetration length.

20. The method of claim 18, wherein the penetration length is determined by:
measuring a variation of electrical characteristics of the unit cells within the edge region relative to one or more unit cells within the central region;
identifying the unit cells having the variation that is larger than a threshold as being subject to the shape tolerance stress; and
defining the penetration length of the shape tolerance stress as a number of unit cells that abut along the direction perpendicular to the border of the central region that have the shape tolerance stress.

* * * * *